United States Patent
Gu et al.

(10) Patent No.: US 8,633,562 B2
(45) Date of Patent: Jan. 21, 2014

(54) VOLTAGE SWITCHABLE DIELECTRIC FOR DIE-LEVEL ELECTROSTATIC DISCHARGE (ESD) PROTECTION

(75) Inventors: Shiqun Gu, San Diego, CA (US); Ratibor Radojcic, San Diego, CA (US); Yiming Li, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 126 days.

(21) Appl. No.: 13/078,672

(22) Filed: Apr. 1, 2011

(65) Prior Publication Data

US 2012/0248582 A1    Oct. 4, 2012

(51) Int. Cl.
*H01L 23/58* (2006.01)

(52) U.S. Cl.
USPC ........... 257/491; 257/492; 257/632; 257/595; 257/355; 257/777; 257/E29.007; 257/E29.008; 438/758; 438/379

(58) Field of Classification Search
USPC ................. 257/491, 492, 632, 595, 355, 777, 257/E29.007, E29.008; 438/758, 379
See application file for complete search history.

(56) References Cited

U.S. PATENT DOCUMENTS

| | | | |
|---|---|---|---|
| 7,633,735 B2 | 12/2009 | Urakawa | |
| 7,923,844 B2 | 4/2011 | Kosowsky | |
| 2004/0169275 A1 | 9/2004 | Danvir et al. | |
| 2007/0114640 A1* | 5/2007 | Kosowsky | 257/666 |
| 2010/0047969 A1 | 2/2010 | Kim et al. | |
| 2010/0059869 A1 | 3/2010 | Kaskoun et al. | |
| 2010/0091475 A1 | 4/2010 | Toms et al. | |
| 2011/0211319 A1* | 9/2011 | Kosowsky et al. | 361/763 |

OTHER PUBLICATIONS

"Printed Circuit Board and Semiconductor Package Design Integration," Technology : Design Support, 2009 Shocking Technologies, http://www.shockingtechnologies.com/tech_support.asp.
Voltage Switchable Dielectric™ (VSD™) Material, Technology: Overview, 2009 Shocking Technologies, http://www.shockingtechnologies.com/tech_overview.asp.
Voltage Switchable Dielectric™ Materials and Integration, Applications : Overview, 2009 Shocking Technologies, http://www.shockingtechnologies.com/app_overview.asp.
International Search Report and Written Opinion—PCT/US2012/031861—ISA/EPO—Oct. 26, 2012.

* cited by examiner

*Primary Examiner* — Tu-Tu Ho
(74) *Attorney, Agent, or Firm* — Sam Talpalatsky; Nicholas J. Pauley; Joseph Agusta

(57) ABSTRACT

A voltage-switchable dielectric layer may be employed on a die for electrostatic discharge (ESD) protection. The voltage-switchable dielectric layer functions as a dielectric layer between terminals of the die during normal operation of the die. When ESD events occur at the terminals of the die, a high voltage between the terminals switches the voltage-switchable dielectric layer into a conducting layer to allow current to discharge to a ground terminal of the die without the current passing through circuitry of the die. Thus, damage to the circuitry of the die is reduced or prevented during ESD events on dies with the voltage-switchable dielectric layer. The voltage-switchable dielectric layer may be deposited on the back side of a die for protection during stacking with a second die to form a stacked IC.

11 Claims, 7 Drawing Sheets

VOLTAGE SWITCHABLE DIELECTRIC FOR DIE-LEVEL ELECTROSTATIC DISCHARGE (ESD) PROTECTION

TECHNICAL FIELD

The present disclosure generally relates to integrated circuits (ICs). More specifically, the present disclosure relates to electrostatic discharge (ESD) protection of integrated circuits.

BACKGROUND

Electrostatic discharge (ESD) events are a common part of everyday life and some of the larger discharges are detectable by the human senses. Smaller discharges go unnoticed by human senses because the ratio of discharge strength to surface area over which the discharge occurs is very small.

Integrated circuits (ICs) have been shrinking at an incredible rate over past decades. As transistors shrink in size, the supporting components around transistors generally shrink as well. The shrinking of IC dimensions decreases the ESD tolerance of transistors thereby increasing the sensitivity of integrated circuits to ESD stress.

An ESD event occurs when an object at a first potential comes near or into contact with an object at a second potential. Rapid transfer of charge from the first object to the second object occurs such that the two objects are at approximately equal potential. Where the object with lower charge is an IC, the discharge attempts to find the path of least resistance through the IC to a ground. Often, this path flows through interconnects. Any part of this path that is unable to withstand the energy associated with the discharge sustains damage.

Conventionally, ESD protection structures based upon diodes are built into the IC for protection. These structures are complicated to ensure high voltage protection and fast response times. Because of the complexity, a considerable amount of area (tens to thousands of square microns for each ESD protection structure) of an IC is consumed by ESD protection structures that could otherwise be used for active circuitry. To meet increasing demand in ICs for smaller form factors, the ESD protection circuit size should be reduced.

Thus, there is a need for an ESD protection consuming smaller IC area.

BRIEF SUMMARY

According to an aspect of the present disclosure, an apparatus includes a first die with a first terminal and a second terminal. The apparatus also includes a voltage-switchable dielectric layer on the first die coupled to the first terminal and the second terminal.

In another aspect, a method includes depositing a voltage-switchable dielectric layer on a first die between a first terminal and a second terminal.

In still another aspect, an apparatus includes a first die with a first terminal and a second terminal. The apparatus also has means for protecting the first die from electrostatic discharge on the first die. The electrostatic discharge protecting means is coupled to the first terminal and the second terminal.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

A voltage-switchable dielectric layer may be deposited on a die as an electrostatic discharge (ESD) protection structure. The single dielectric layer reduces the amount of die area occupied by the ESD protection structure and allows the construction of smaller form factor ICs without compromising the ICs capability to withstand ESD events. The voltage-switchable dielectric layer is a dielectric layer that functions as an insulator in a first low voltage range of operations. In a second, higher range of voltages the voltage-switchable dielectric layer switches to a conductive layer.

Figure 1:
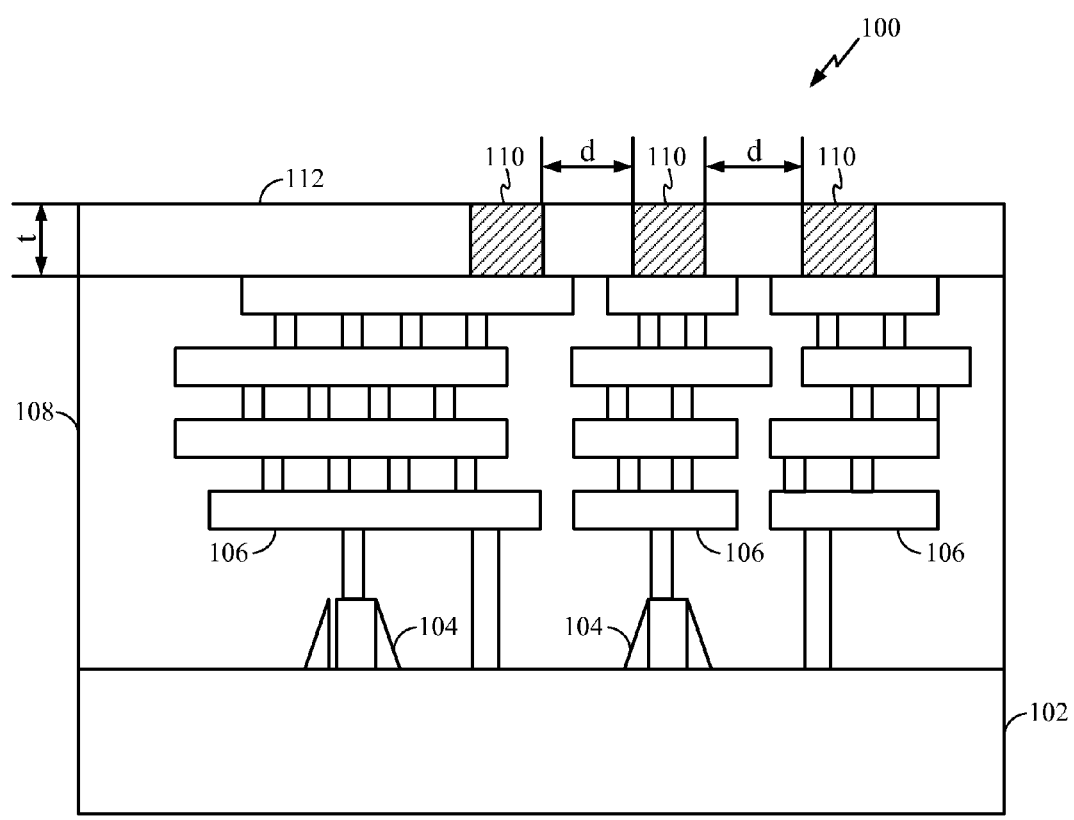
FIG. 1 is a cross-sectional view illustrating an exemplary die with electrostatic discharge protection according to a first embodiment.

FIG. 1 is a cross-sectional view illustrating an exemplary die with electrostatic discharge protection according to a first embodiment. A die 100 includes a substrate 102 with transistor gates 104 coupled to interconnects 106. The interconnects 106 are separated from other interconnects by a dielectric layer 108. Terminals 110 couple to the interconnects 106 to provide communication between the transistor gates 104 and external circuitry (not shown). In one embodiment, the leftmost terminal 110 couples to a ground, the rightmost terminal 110 couples to a power supply, and the middle terminal 110 couples to I/O (input/output).

During manufacturing, handling, or operation of the die 100 high voltages may develop between the terminals 110 resulting in a ESD event. During the ESD event, discharge current seeks the lowest path of resistance to ground, which may be through the interconnects 106, the transistor gates 104, the substrate 102, and to another terminal of the terminals 110. The discharge may result in damage to the interconnects 106, the transistor gates 104, or the substrate 102.

A voltage-switchable dielectric layer 112 deposited between the terminals 110 provides a low resistance current path during ESD events. For example, when an ESD event results in a voltage across two of the terminals 110 exceeding a switchable voltage of the voltage-switchable dielectric layer 112, the voltage-switchable dielectric layer 112 switches to a conducting state and current flows substantially from one of the terminals 110 through the voltage-switchable dielectric layer 112 to another one of the terminals 110. The interconnects 106, the transistor gates 104, and the substrate 102 experience a reduced current flow as a result of current conduction in the voltage-switchable dielectric layer 112.

After the ESD event has concluded and the voltage between the terminals 110 reduces below the switching voltage of the voltage-switchable dielectric layer 112, the voltage-switchable dielectric layer 112 returns to an insulating state and does not conduct current between the terminals 110. According to one embodiment, little or no damage occurs to the voltage-switchable dielectric layer 112, such that the voltage-switchable dielectric layer 112 may continue to protect the die 100 from ESD events. For example, the voltage-switchable dielectric layer 112 may have self-healing properties.

The switching voltage of the voltage-switchable dielectric layer 112 between two of the terminals 110 is dependent, in part, on material properties of the voltage-switchable dielectric layer 112 and a distance between the two terminals 110 participating in the ESD event. For example, as the distance between the two terminals 110 participating in the ESD event increases, the switching voltage for conducting between the two terminals 110 through the voltage-switchable dielectric layer 112 increases. That is, the dielectric breakdown voltage of the voltage-switchable dielectric layer is in tens of Volts. According to one embodiment, the breakdown voltage of the voltage-switchable dielectric layer 112 is also adjustable by altering portions of the voltage-switchable dielectric layer 112 to increase or decrease the breakdown voltage between two of the terminals 110.

The distance, d, between the terminals 110 may be selected to coincide with a desired switching voltage for the voltage-switchable dielectric layer 112. For example, a distance between two of the terminals 110 may be selected such that during normal operation of the die in a first range of voltages the voltage-switchable dielectric layer 112 is an insulating layer and during an ESD event in a second range of higher voltages the voltage-switchable dielectric layer 112 is a conducting layer. The distance may be selected so that the first range of voltages during which the voltage-switchable dielectric layer 112 is an insulating layer extends from zero Volts to at least a supply voltage of the die 100. The thickness, t, can similarly be selected.

The voltage-switchable dielectric layer 112 may be deposited on the dielectric layer 108 following fabrication of the interconnects 106 and the dielectric layer 108 and the interconnects 106. After deposition of the voltage-switchable dielectric layer 112, openings may be formed in the voltage-switchable dielectric layer 112 into which the terminals 110 are deposited.

Figure 2:
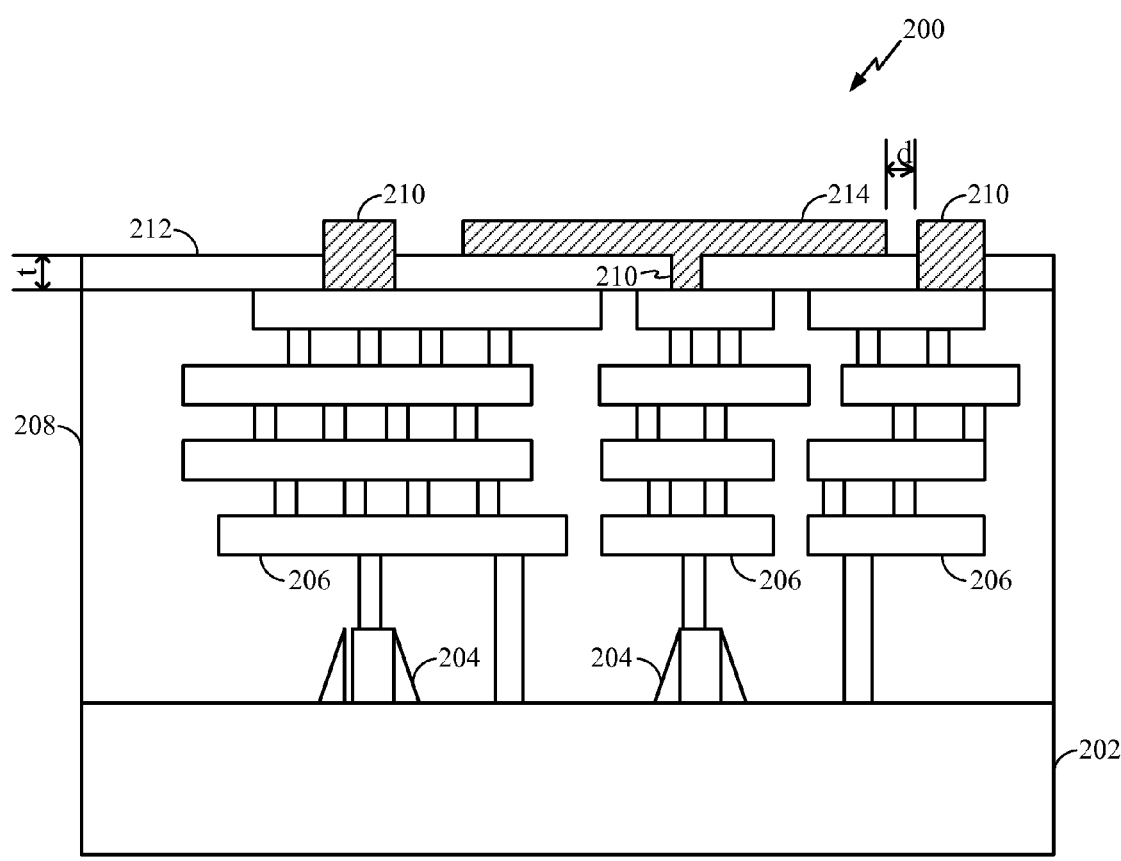
FIG. 2 is a cross-sectional view illustrating an exemplary die with electrostatic discharge protection according to a second embodiment.

The voltage-switchable dielectric layer may also be placed in a configurations on a die with a pad. FIG. 2 is a cross-sectional view illustrating an exemplary die with electrostatic discharge protection according to a second embodiment. A die 200 includes a substrate 202 having transistor gates 204 coupled to interconnects 206. The interconnects 206 are separated by a dielectric layer 208. A voltage-switchable dielectric layer 212 is deposited on the dielectric layer 208 through which the terminals 210 are coupled to the interconnects 206. In one embodiment, the leftmost terminal 210 couples to a ground, the rightmost terminal 210 couples to a power supply, and the middle terminal 210 couples to I/O (input/output).

A pad 214 may couple to one of the terminals 210 and extend over the voltage-switchable dielectric layer 212. During an ESD event involving the pad 214 and one of the terminals 210, current flows from the pad 214, through the voltage-switchable dielectric layer 212, to one of the terminals 210. The switching voltage of the voltage-switchable dielectric layer 212 depends, in part, on the thickness, t, of the voltage-switchable dielectric layer 212 between the pad 214 and a neighboring one of the interconnects 206 through which the path of least resistance follows. For example, the path of least resistance for an ESD current may be from the leftmost terminal 210, to the top leftmost interconnect layer 206, through the voltage-switchable dielectric layer 212, and to the pad 214. The overlap between the pad 214 and the terminals 210 can be adjusted to meet the designed discharge current target. Similarly, the distance, d, between the pad 214 and the leftmost terminal 210 can be selected to control the switching voltage of the voltage-switchable dielectric layer 212.

Figure 3:
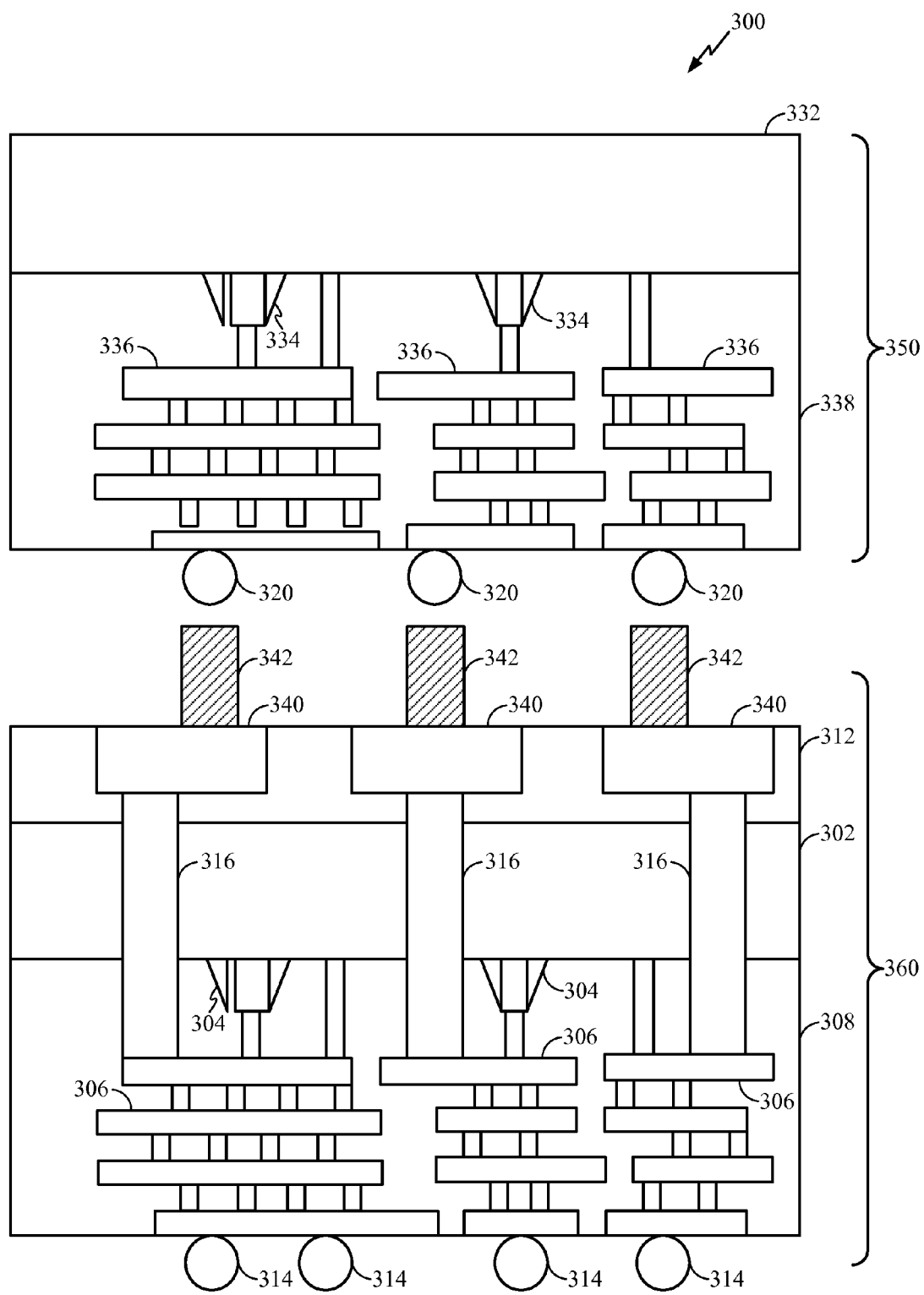
FIG. 3 is a cross-sectional view illustrating an exemplary stacked die with electrostatic discharge protection according to a first embodiment.

A voltage-switchable dielectric layer may also be used to protect stacked ICs from ESD events. For example, an ESD event may occur during the handling or shipping of a first tier die or a second tier die. An ESD event may also occur during coupling of the first tier die to the second tier die if the first tier die is at a different potential than the second tier die. FIG. 3 is a cross-sectional view illustrating an exemplary stacked die with electrostatic discharge protection according to a first embodiment. A stacked die 300 includes a first tier die 360 and a second tier die 350. The first tier die 360 includes a packaging connection 314 coupled to interconnects 306. The interconnects 306 are separated by a dielectric layer 308 and couple to transistor gates 304 on a substrate 302. The interconnects 306 also couple to through vias 316, to interconnects 340, and to terminals 342. In one embodiment, the leftmost terminal 342 couples to a ground, the rightmost terminal 342 couples to a power supply, and the middle terminal 342 couples to I/O (input/output).

A voltage-switchable dielectric layer 312 deposited on a back-side of the substrate 302 of the first tier die 360 provides a conduction path between the terminals 342. The terminals 342 are coupled to a packaging connection 320 of the second die 350. The packaging connection 320 couples to interconnects 336, transistor gates 334, and the substrate 332. A dielectric layer 338 separates the interconnects 336.

During an ESD event, such as when the second die 350 is coupled to the first tier die 360, current may flow from one of the terminals 342 to the interconnects 340, through the voltage-switchable dielectric layer 312 to another one of the interconnects 340, and through another one of the terminals 342 to ground. The switching voltage for the voltage-switchable dielectric layer 312 between two of the terminals 342 depends, in part, on the distance between the interconnects 340.

Figure 4:
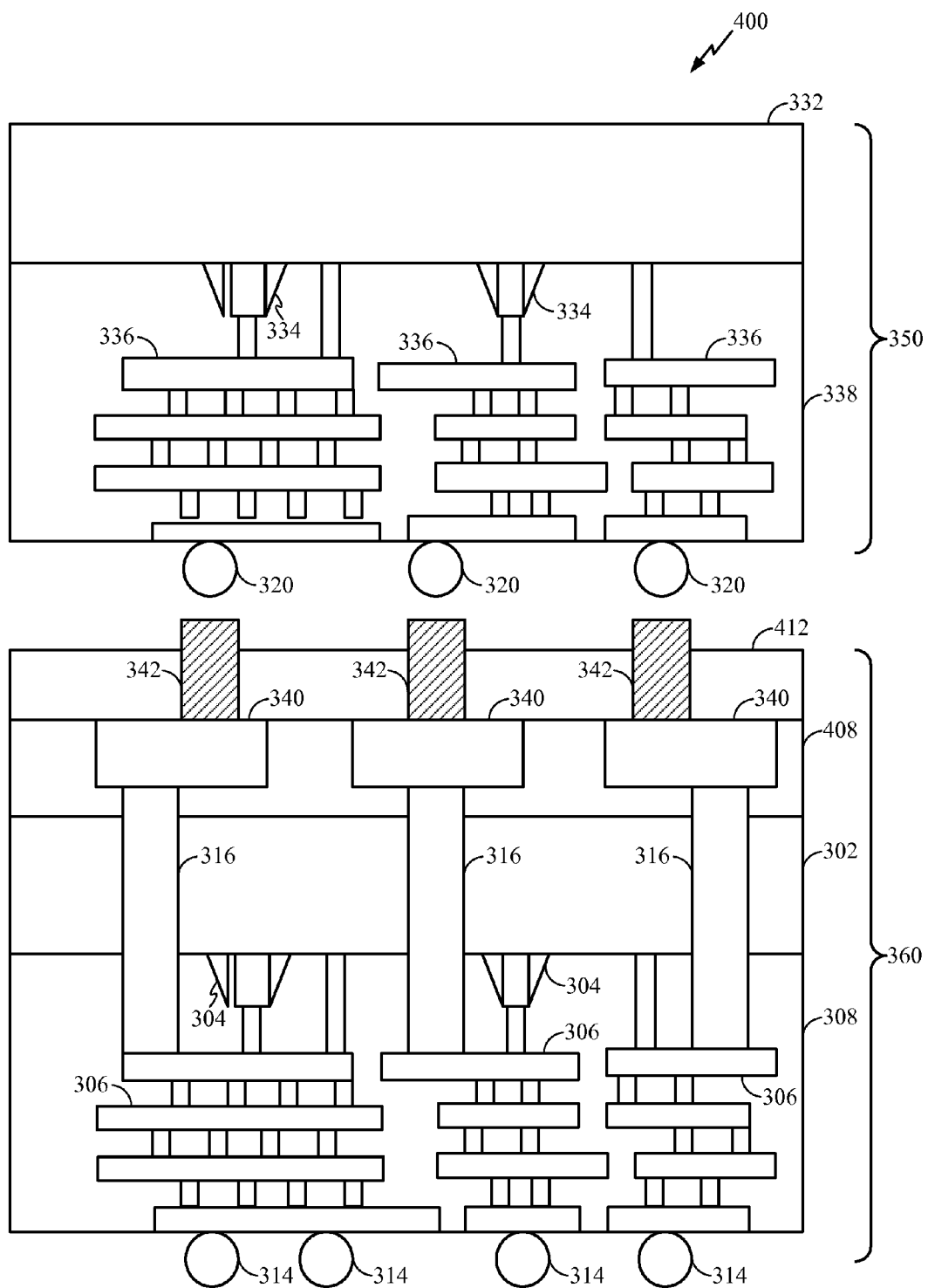
FIG. 4 is a cross-sectional view illustrating an exemplary stacked die with electrostatic discharge protection according to a second embodiment.

According to one embodiment, a dielectric layer may be placed between the substrate and the voltage-switchable dielectric layer. FIG. 4 is a cross-sectional view illustrating an exemplary stacked die with electrostatic discharge protection according to a second embodiment. A dielectric 408 is deposited on a back-side of the substrate 302, and interconnects 340 couple terminals 342 to the through vias 316. In one embodiment, the leftmost terminal 342 couples to a ground, the rightmost terminal 342 couples to a power supply, and the middle terminal 342 couples to I/O (input/output).

A voltage-switchable dielectric layer 412 is deposited on the dielectric layer 408 and partially surrounds the terminals 342. According to one embodiment, after the voltage-switchable dielectric layer 412 is deposited on the dielectric layer 408, the voltage-switchable dielectric layer 412 is patterned and the terminals 342 are deposited in the patterned voltage-switchable dielectric layer 412. The switching voltage for the voltage-switchable dielectric layer 412 between the terminals 342 is based, in part, on the distance between the terminals 342 involved in an ESD event.

Figure 5:
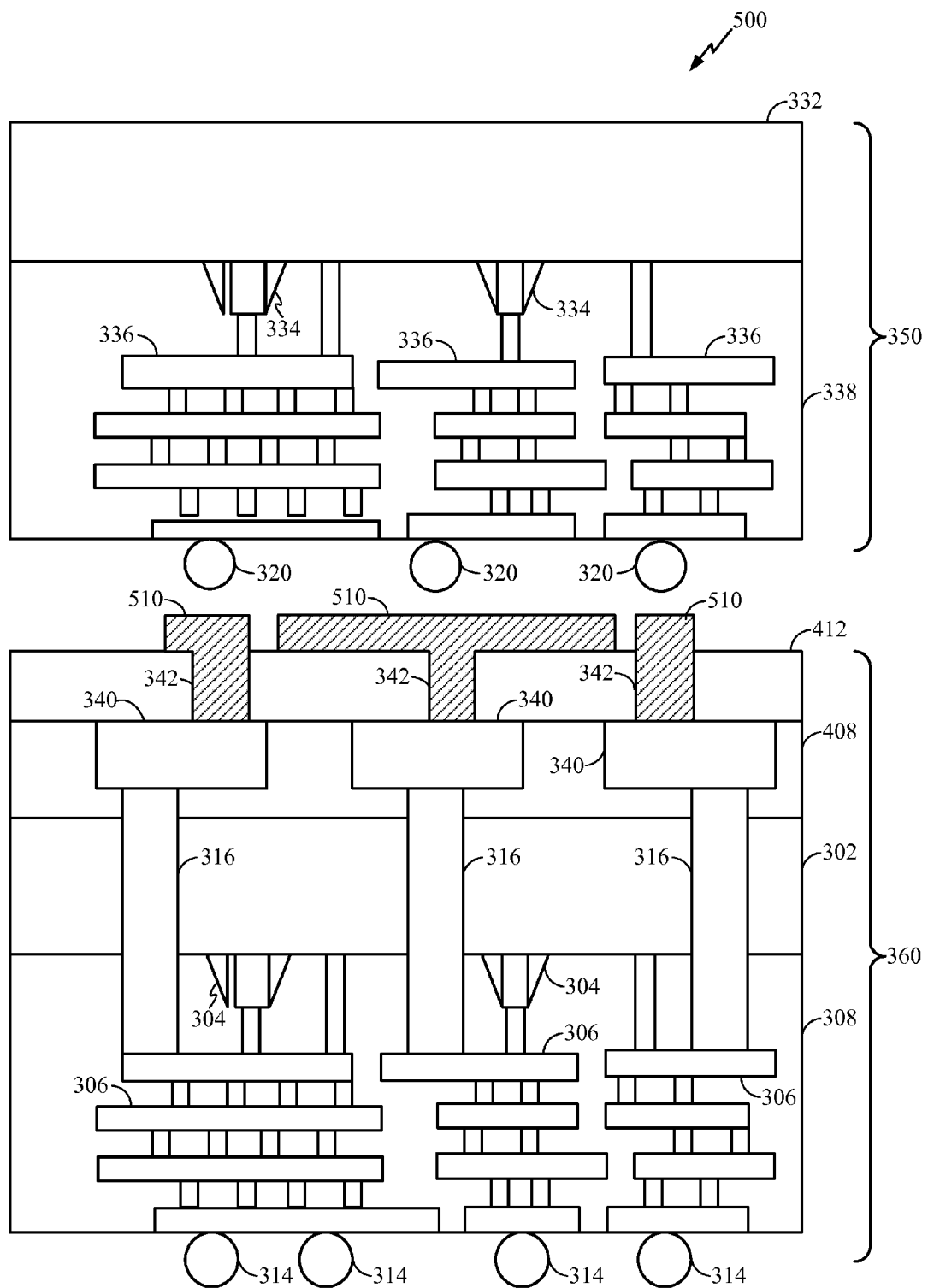
FIG. 5 is a cross-sectional view illustrating an exemplary stacked die with electrostatic discharge protection according to a third embodiment.

According to another embodiment, pads may be deposited as terminals on the voltage-switchable dielectric layer. FIG. 5 is a cross-sectional view illustrating an exemplary stacked die with electrostatic discharge protection according to a third embodiment. Pads 510 are deposited on the voltage-switchable dielectric layer 412 and couple to the terminals 342. When current from an ESD event is conducted through the voltage-switchable dielectric layer 412 of FIG. 5, the switching voltage is determined, in part, on the thickness of the voltage-switchable dielectric layer 412 between the pad 510 and the interconnect 340 when the path of least resistance for current is from the voltage-switchable dielectric layer 412 to the interconnect 340. The pads 510 may be coupled to ground, power and/or input/output lines of the second die 350. In one embodiment, the leftmost pad 510 couples to a ground, the rightmost pad 510 couples to a power supply, and the middle pad 510 couples to the I/O (input/output) lines.

A voltage-switchable dielectric layer deposited on a die provides ESD protection for circuitry on the die and consumes little to no additional die area. Thus, a die employing the voltage-switchable dielectric layer for ESD protection may have a smaller form factor than dies incorporating conventional ESD protection circuits and structures. The switching voltage may be controlled by, for example, the material properties of the voltage-switchable dielectric layer, the thickness of the voltage-switchable dielectric layer, and the distance between terminals on the die surrounded by the voltage-switchable dielectric layer. In one embodiment, the voltage-switchable dielectric layer is VOLTAGE SWITCHABLE DIELECTRIC available from Shocking Technologies, Inc. of San Jose, Calif.

Figure 6:
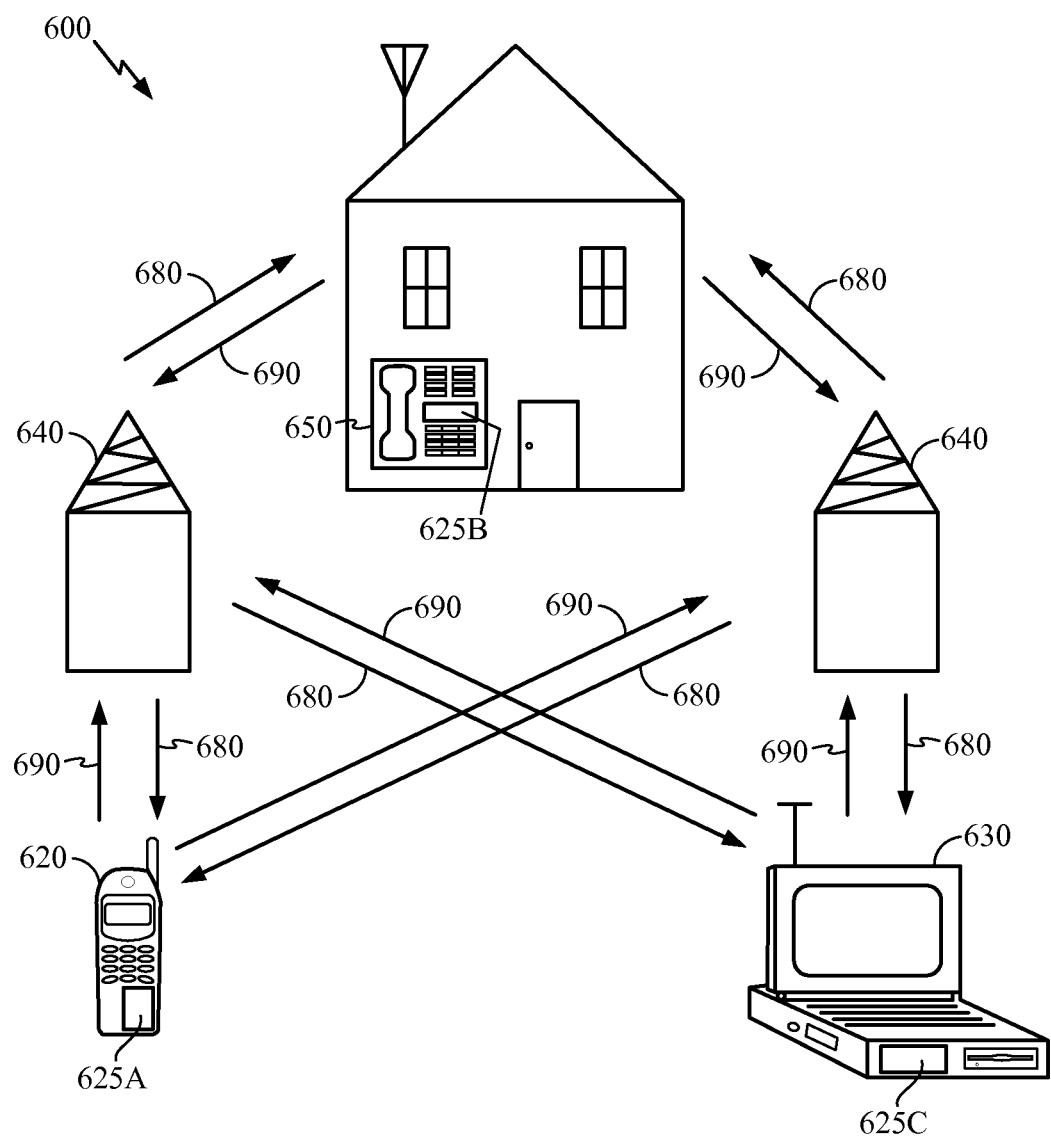
FIG. 6 is a block diagram showing an exemplary wireless communication system in which an embodiment of the disclosure may be advantageously employed.

FIG. 6 is a block diagram showing an exemplary wireless communication system 600 in which an embodiment of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C and 625B, that include the disclosed ESD protection. It will be recognized that any device containing an IC may also include the ESD protection disclosed here, including the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 830 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes ESD protection.

Figure 7:
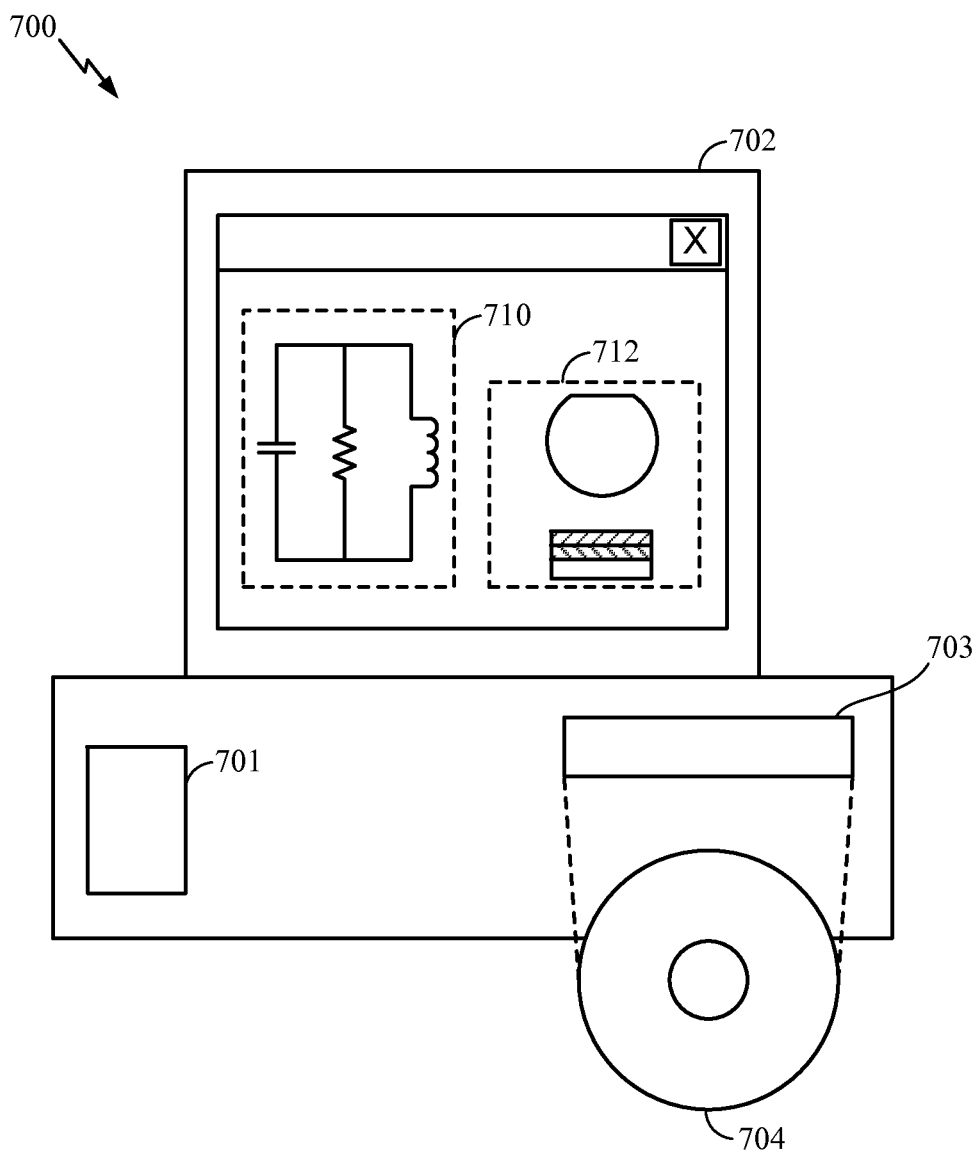
FIG. 7 is a block diagram illustrating a design workstation used for circuit, layout, and logic design of a semiconductor component according to one embodiment.

FIG. 7 is a block diagram illustrating a design workstation used for circuit, layout, and logic design of a semiconductor component, such as an ESD protection configuration as disclosed above. A design workstation 700 includes a hard disk 701 containing operating system software, support files, and design software such as Cadence or OrCAD. The design workstation 700 also includes a display to facilitate design of a circuit 710 or a semiconductor component 712 such as a packaged integrated circuit having ESD protection. A storage medium 704 is provided for tangibly storing the circuit design 710 or the semiconductor component 712. The circuit design 710 or the semiconductor component 712 may be stored on the storage medium 704 in a file format such as GDSII or GERBER. The storage medium 704 may be a CD-ROM, DVD, hard disk, flash memory, or other appropriate device. Furthermore, the design workstation 700 includes a drive apparatus 703 for accepting input from or writing output to the storage medium 704.

Data recorded on the storage medium 704 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 704 facilitates the design of the circuit design 710 or the semiconductor component 712 by decreasing the number of processes for designing semiconductor wafers.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising:
    a first die with a first terminal and a second terminal; and
    a voltage-switchable dielectric layer on the first die coupled to the first terminal and the second terminal, in which a distance between the first terminal and the second terminal is selected to control an electrostatic discharge protection voltage of the voltage-switchable dielectric layer.

2. The apparatus of claim 1, in which the voltage-switchable dielectric layer is on a back side of the first die opposite a front side of the first die having active circuitry.

3. The apparatus of claim 1, in which a top surface of the voltage-switchable dielectric layer is substantially level with a top surface of the first terminal.

4. The apparatus of claim 1, in which a thickness of the voltage-switchable dielectric layer is selected to control an electrostatic discharge protection voltage of the voltage-switchable dielectric layer.

5. The apparatus of claim 1, in which the first terminal is a power supply terminal and the second terminal is a ground terminal.

6. The apparatus of claim 1, in which the first die further comprises a pad, and the voltage-switchable dielectric layer is coupled to the pad.

7. The apparatus of claim 1, further comprising a second die coupled to the first die, in which the voltage-switchable dielectric layer provides electrostatic discharge protection for the first die from a high voltage on the second die.

8. The apparatus of claim 1, integrated into at least one of a mobile phone, a set top box, a music player, a video player, an entertainment unit, a navigation device, a computer, a hand-held personal communication systems (PCS) unit, a portable data unit, and a fixed location data unit.

9. An apparatus, comprising:
    a first die with a first terminal and a second terminal; and
    means for protecting the first die from electrostatic discharge on the first die, the electrostatic discharge protecting means being coupled to the first terminal and the second terminal, in which a distance between the first terminal and the second terminal is selected to control an electrostatic discharge protection voltage of the electrostatic discharge protecting means.

10. The apparatus of claim 9, in which the electrostatic discharge protection means is on a back side of the first die opposite a front side of the first die having active circuitry, and the apparatus further comprising a second die coupled to the back side of the first die.

11. The apparatus of claim 9, integrated into at least one of a mobile phone, a set top box, a music player, a video player, an entertainment unit, a navigation device, a computer, a hand-held personal communication systems (PCS) unit, a portable data unit, and a fixed location data unit.

* * * * *